HIGH CAPACITANCE MICROELECTRONIC DECOUPLING DEVICE WITH LOW SHUNT RESISTANCE AT HIGH FREQUENCIES

Filed April 16, 1964 3 Sheets-Sheet 1

INVENTORS
HAROLD D. KAISER
DONALD D. METZGER

BY [signature]
ATTORNEY

United States Patent Office 3,268,744

Patented August 23, 1966

3,268,744

HIGH CAPACITANCE MICROELECTRONIC DECOUPLING DEVICE WITH LOW SHUNT RESISTANCE AT HIGH FREQUENCIES

Harold D. Kaiser, Poughkeepsie, and Donald D. Metzger, La Grange, N.Y., assignors to International Business Machines Corporation, New York, N.Y., a corporation of New York Filed Apr. 16, 1964, Ser. No. 360,323
7 Claims. (Cl. 307—93)

This invention relates to a high capacitance decoupling device for employment in microelectronic circuits and more particularly to such a device employing a composition of N and P type oxide semiconductor materials which composition is characterized by a high dielectric constant, a high A.C. loss, a high D.C. resistance and the lack of a ferro-electric effect.

In the evolution of circuit design for digital computers and other electronic devices, the trend has been toward the development of miniaturization of the electronic components or the so-called microelectronic circuits employing a plurality of modules each of which may contain a given number of capacitors, resistors, transistors and the like. High speed, and other microelectronic module circuits are usually characterized by a low impedance which must be matched by low impedances provided by adjacent parts of the circuitry. To apply appropriate voltage biases to such a module, the power supply is coupled through the module to ground or to some other voltage source to provide the required low impedance. However, microelectronic modules often suffer a loss of low impedance in the power supply to ground circuit because of the inductances of the conductor leads to the respective modules.

Another disadvantage of prior art microelectronic circuits is that severe noise transients can arise in the power supply circuit due to the very fast switching times of the module circuit. This disadvantage can be overcome by coupling the power supply circuit to ground with a suitable capacitor to lower the effective power supply impedance. However, large capacitance devices usually require a physical space not compatible with the small size of the individual modules and, furthermore, such a capacitor along with the module lead inductance and power supply impedance usually form an inductive loop which oscillates after a switching pulse with a resultant "ringing" that can lead to a circuit malfunction. This undesirable ringing can be overcome by introducing a resistive loss into the capacitor circuit. However, if this resistive loss is introduced in series with the above described capacitor, the desired damping of such ringing is achieved only at the expense of the low transient impedance of the capacitor and, if such a resistive loss is introduced in parallel with this capacitor, there results an excessive D.C. power supply dissipation in the resistor causing undesirable module heating.

As contemplated in the present invention, an improved microelectronic module circuit is achieved by the employment of capacitors characterized by a large capacity and a low direct current loss without affecting the high frequency damped response of the circuit. Such a high capacitance decoupling device when placed on a microelectronic module between the power supply and ground not only serves to lower the effective power supply impedance but also introduces appropriate damping at high frequencies of any ringing that might cause circuit malfunction without causing undue heating of the module.

It is then a major object of the present invention to provide an improved high capacitance decoupling device for microelectronic circuits.

It is another object of the present invention to provide an improved high capacitance decoupling device for employment with a microelectronic module that minimizes the loss of low impedance in the power supply to ground circuit.

It is still another object of the present invention to provide an improved high capacitance decoupling device for a microelectronic circuit that provides efficient dampening of severe noise transients and oscillations.

It is still a further object of the present invention to provide an improved high capacitance decoupling device for a microelectronic module which is of sufficiently small size to be compatible with employment in such a module.

In the microelectronic art, capacitors for a circuit module are normally in the form of two film electrodes between which is dielectric is secured. The dielectric is preferably applied in a paste form by silk screening and then fired at a curing temperature. To achieve the above described objects, the present invention resides in the employment of a unique dielectric material having a high dielectric constant as well as high resistivity that decreases as a function of frequency without being characterized by ferro-electric effects.

While many dielectrics are disclosed in the prior art which are free of ferro-electric characteristics, such dielectrics have relatively low dielectric constants and capacitors employing such dielectrics have relatively low capacitance values. On the other hand, certain ferro-electric materials have been discovered to have relatively high dielectric constants particularly in the neighborhood of their ferro-electric Curie temperature. However, in addition to the hysteresis effect from which such ferro- electric materials obtain their name, these materials are also characterized by piezoelectric effects and more importantly the dielectric constants of such materials are noticeably temperature dependent.

It has been discovered that the required characteristics of the present invention can be obtained from a sintered mixture of N and P type semiconductor oxide materials. It has also been discovered that the addition of certain oxide semiconductor materials to the film electrodes serves to further enhance the desired electrical characteristics.

It is generally well known that conduction in oxide semiconductors results from the defect structures of the oxides or from the lack of a stoichiometric balance between component atoms. When the oxygen concentration is increased with the resulting decrease in the conductivity of certain oxide semiconductors, these oxides are called reduction semiconductors and the conduction is due to an excess of electrons (N-type conduction). On the other hand, in other oxide semiconductors, an increased oxygen concentration results in increased conductivity in which case the oxides are referred to as oxidation conductors and the conduction is by way of "holes" (P-type conduction). In the case of either type of oxide semiconductor, the dielectric constant is relatively small, i.e. of the order of ten for single crystals, and such oxide semi-conductors are not normally considered to be good dielectrics. However, semiconductors more generally resemble dielectrics than they do metal conductors and may be distinguished from pure dielectrics by, among other things, the value of their conductivity or more specifically their resistivity. In general, pure dielectrics are considered to have a resistivity of more than $10^{10}$ ohm-centimeters, while semiconductors may have a resistivity of the order of $10^4$–$10^5$ ohm-centimeters.

Capacitors which are adaptable for employment in microelectronic circuitry and more particularly on circuit modules of the type anticipated in the present invention would be ideal if characterized by a capacitance of the order of $10^5$ pico-farads (pf.)/in.$^2$, a D.C. conductance of the order of .01 ohm$^{-1}$/in.$^2$ and a total impedance of about 10 ohms/in.$^2$ at 10 megacycles. Dielectric materials for such a capacitor which are of a semiconductor type as discussed above would provide the proper resistivity and would be suitable for such capacitors if particular semiconductor compositions could be found having a dielectric constant of the order of 1000.

Particular materials having the above described characteristics include the combination of at least 94% zinc oxide (ZnO) and no more than 6% bismuth trioxide ($Bi_2O_3$) and the combination of at least 94% zinc oxide and no more than 6% lead oxide (PbO) where the zinc oxide is an N-type semiconductor material and the lead oxide and bismuth trioxide are P-type semiconductor materials. Other P-type semiconductor materials that may be employed include cupric oxide (CuO) and cuprous oxide ($Cu_2O$).

A principal feature of the present invention, then, resides in a capacitor having a dielectric material characterized by a high dielectric constant and a high direct current resistivity which material is a sintered mixture of primarily zinc oxide with the addition of a P-type semiconductor oxide.

More particularly, a feature of the present invention resides in such a capacitor wherein the P-type semiconductor oxide is selected from the group of bismuth trioxide, lead oxide, cupric oxide and cuprous oxide.

An even more specific feature of the present invention resides in a capacitor of the above described type wherein a semiconductor oxide has been added to the electrode material.

Other objects, advantages and features of the present invention will become readily apparent from a review of the following description when taken in conjunction with the drawings wherein.

Figure 1:
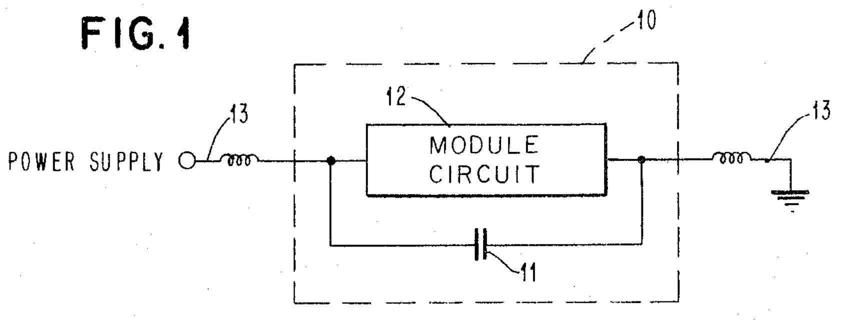
FIGURE 1 is schematic representations of a power supply for a microelectronic module and the circuit thereon.
Figure 2:
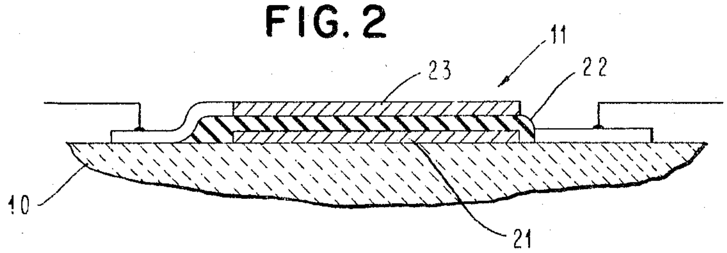
FIGURE 2 is a cross-sectional view of the structure of a capacitor of the present invention.

Referring briefly to FIGURE 1, this figure illustrates the power supply circuit for microelectronic module 10 in which capacitor 11 has been placed in parallel with module circuit 12 to prevent severe noise transients in the power supply to ground circuit 13 which may result in false signals and switching in other circuits connected to the module. As contemplated in the present invention, this capacitance is in the form of a high capacitance decoupling device wherein the dielectric of the capacitance is characterized by a low A.C. resistivity to dampen oscillations in the power supply circuitry. The structure of the capacitance device of the present invention as employed in a microelectronic module is illustrated in FIG. 2. This film capacitor 11 is fabricated by a conventional silk screening technique by which first electrode 21 of a gold-platinum composition is deposited on the module 10 and then fired at the appropriate temperature; the process being continued to deposit dielectric material 22 and second electrode film 23. If it is so desired, a plurality of film electrodes and dielectrics may be sandwiched together. The dimensions of the respective electrodes and dielectrics as employed in such a microelectronic module could be of the order of 0.020 inch on a side and the thickness of the dielectric would be of the order of 0.5–0.7 mil.

To prepare the dielectric materials of the present invention, particular steps are employed although these are not necessary to achieve the present invention. The respective materials are ground in a mortar and pestle for a period of two hours. The vehicle for carrying the materials is a specific amount of water in this initial step. The resultant mixture is them dried and an organic vehicle is added with the mixture then being dispersed in the mortar and pestle for an additional half hour. The reason for employing water in the initial grinding step is that it has been found that the organic vehicle acts as a lubricant and hinders the grinding action. Furthermore, the grinding action tends to evaporate the organic vehicle.

To obtain the particular compositions as described in the present application, the respective oxide semiconductor materials are placed in the mortar and pestle in their respective proportions by weight as required. The resultant powdered mixture as obtained from the above described grinding operation is then mixed with a squeegee medium for later screening and firing in the ratios of approximately 70% of the powdered mixture to 30% of the squeegee medium.

The particular procedure of fabricating a capacitor of the present invention includes the screening and firing of the bottom electrode using standard procedures after which the layer of the dielectric material which was obtained as described in the previous paragraph is screened onto the bottom electrode. The combination is then dried at 150° centrigrade for 15 minutes after which a second layer of the dielectric material is screened onto the first layer and the combination is allowed to set for one half hour and then further dried at 150° centrigrade for 15 minutes. The top electrode material is then screened onto the combination which is dried at 150° centigrade for 15 minutes and placed on a stainless steel firing plate and inserted in a furnace for firing. The preferable firing temperatures and firing time are, respectively, 1000° centigrade and one hour. However, different firing temperatures and firing times can be employed, the results of which are further described below. The resultant capacitor is then removed from the furnace and quickly placed on a large aluminum block to quench. When it is desired to obtain a multiple layer capacitor, the above described steps of screening and drying are repeated as often as necessary before the final firing.

Of the different N and P type oxide materials contemplated for the dielectric material of the present invention, the highest dielectric constant and resistivity are found to be obtained for a combination of zinc oxide and bismuth trioxide. Zinc oxide and bismuth trioxide separately have relatively low dielectric constants with polycrystalline zinc oxide having a dielectric constant of approximately 40–60 and polycrystalline bismuth trioxide having a dielectric constant of approximately 20–30. However, when these two materials are combined in a sintered mixture, the dielectric constant is raised to approximately 1000 when the content of the bismuth trioxide is varied from 0 to 6% by weight with the optimum value of the dielectric constant being achieved for approximately 3–5% of the bismuth trioxide by weight.

Calculations of the dielectric constant were obtained from the following formula:

$$Ke = \frac{cd}{0.225A}$$

where the capacitor is assumed to be of the usual parallel plate type and where $c$ is the capacitance, $d$ is the spacing between the respective electrode plates in inches. A is the area of the capacitor in square inches and the figure 0.225 is a conversion factor dependent upon the respective units of area, distance and capacitance. While it would be expected that the capacitance $c$ would be inversely proportional to $d$, it has been found for these oxide type semiconductor devices that $$c = \frac{1}{d} + c_1$$

where $c_1$ is a constant capacitance due to electrode effects.

When bismuth trioxide is also added to the electrode material the effect thereof on the dielectric constant of the combination is to give an apparent dielectric constant that may vary from 1000 to more than 2000. The particular electrode material to which the oxide is added does not appear to be critical and may be platinum although a preferred material is a combination of gold and platinum in the ratio of 80/20.

Figure 3:
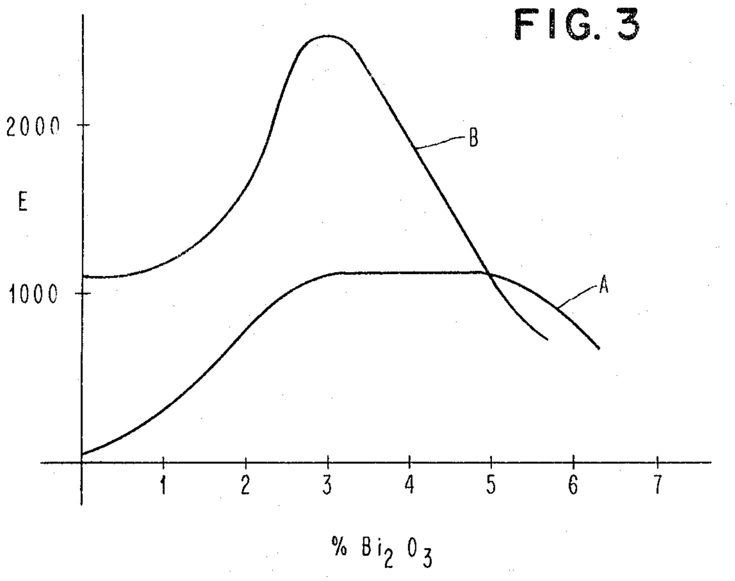
FIGURE 3 is a graph showing the effect of the addition of bismuth trioxide to the dielectric material.

The effects of adding bismuth trioxide to the zinc oxide is illustrated graphically in FIGURE 3 which is a plot of dielectric constant versus the percentage of bismuth trioxide added. Curve A in FIGURE 3 represents the measurement of the dielectric constant for a capacitor having electrodes formed of a platinum paste, the paste further including 2% glass. Curve B in FIGURE 3 represents the measurement of the dielectric constant for a capacitor employing electrodes of gold-platinum with approximately 7% bismuth trioxide added to the paste. The values of the dielectric constants from which curves A and B in FIGURE 3 were drawn are listed in the following table which also includes the resistivity of the dielectric for the various percentages of bismuth trioxide.

TABLE I

| Percent $Bi_2O_3$ | Electrode Binder | Dielectric Constant | Resistivity (Ohm-cm.) |
|---|---|---|---|
| 0 | Lead Glass | 80 | $1.6\times10^5$ |
| 2 | do | 785 | $4.7\times10^3$ |
| 3 | do | 1,100 | $2.1\times10^3$ |
| 4 | do | 1,160 | $8.2\times10^3$ |
| 5 | do | 1,160 | $1.6\times10^4$ |
| 6 | do | 795 | $2.8\times10^4$ |
| 0 | 7% $Bi_2O_3$ | 1,100 | $3.1\times10^4$ |
| 2 | 7% $Bi_2O_3$ | 1,620 | $9.1\times10^4$ |
| 3 | 7% $Bi_2O_3$ | 2,550 | $2.2\times10^4$ |
| 4 | 7% $Bi_2O_3$ | 1,960 | $1.2\times10^5$ |
| 5 | 7% $Bi_2O_3$ | 1,100 | $6.0\times10^4$ |

It will be observed from the above table and the graphs of FIGURE 3 that the dielectric constant increases with the addition of bismuth trioxide to the zinc oxide reaching an optimum value for approximately 3–4% bismuth trioxide after which the value of the dielectric constant decreases such that when the composition contains 6% bismuth trioxide the dielectric constant is considerably below that of the optimum.

A similar effect is achieved by the addition of lead oxide to the zinc oxide with the optimum value again being approximately 3–4% of the P-type semiconductor material. While a similar effect is also found for the addition of cupric and cuprous oxides to the zinc oxide, the increase in the dielectric constant is not as large as that achieved with the bismuth trioxide and lead oxide.

When a P-type semiconductor material is added to the electrode paste, an enhancement of dielectric constant is achieved. This is illustrated in the following table for electrode materials containing 7% and 10% bismuth trioxide and for dielectrics of pure zinc oxide, zinc oxide plus 3%, bismuth trioxide and zinc oxide plus 3% lead oxide:

TABLE II

| Percent $Bi_2O_3$ | Dielectric Material | Apparent Dielectric Constant |
|---|---|---|
| 7 | ZnO | 1,100 |
| 7 | ZnO+3%$Bi_2O_3$ | 2,550 |
| 7 | ZnO+3%PbO | 1,320 |
| 10 | ZnO | 1,700 |
| 10 | ZnO+3%$Bi_2O_3$ | 1,950 |
| 10 | ZnO+3%PbO | 1,350 |

It will be observed from Table II that the increase in the addition of the oxide semiconductor material to the electrode material tends, in some cases, to increase the apparent dielectric constant of the device even where the amount of the oxide material added to the electrode is 10% or greater. This is particularly true in the case where the dielectric material is pure polycrystalline zinc oxide. However, it will be observed in the case of a dielectric material containing 3% bismuth trioxide, that, if the amount of the bismuth trioxide added to the electrode is greater than 7%, then the apparent dielectric constant of the device is decreased. It is quite likely that this phenomenon is similar to an additional increase of the bismuth trioxide to the dielectric material in which case one would expect the apparent dielectric constant to decrease as has been explained above. Moreover, it will be remembered that the primary purpose of the electrode material is to act as a conductor and also to provide for connection between the capacitance device and the circuitry in which it is used. Increasing the amount of the semiconductor added to the electrode material decreases the ability of the electrode material to provide these functions.

From a practical point of view, one required characteristic of the electrode material is its ability to receive solder and it has been observed that an increase in the amount of the semiconductor material added to the electrode decreases this ability. For example, when the electrode material contains 5% bismuth trioxide, it has been found that less than 10% of the resultant capacitor devices will not readily receive a soldered connection and, when 10% bismuth trioxide is added to the electrode material, it has been found that at least 20% of the devices will not take a soldered connection It will be apparent that, from a standpoint of manufacturing costs, a device characterized by 20% or more of rejects is not economically feasible. Thus in the present invention, it is contemplated that the addition of the semiconductor to the electrode material comprise no more than 10% of the oxide semiconductor material.

It will be understood that the above results are dependent upon the firing cycle employed in the manufacture of the dielectric material and the particular results given above are based on the firing cycle of one hour at 1000° centigrade followed by rapid quench to room temperature. In general, the dielectric constant increases with increased firing temperature and increased time of firing at that temperature while the resistivity decreases. For a change of firing temperatures from 900 to 1000° centigrade and firing times from 15 to 60 minutes, the dielectric constant can increase by factor of ten and the resistance can decrease by a factor of four to five.

In addition to the direct current resistivity characteristics of the particular materials involved, the application of these materials in a microelectronic circuit also requires a low high-frequency resistivity. In general, it has been found that, over a range from 500 cycles per second to 50 megacycles per second, the capacitance decreases by approximately 20% per decade and the conductance increases by approximately 400% per decade. Thus, the materials involved in the present invention are quite suitable for microelectronic circuitry wherein it is desirable to have a low impedance in the power supply bus on the microelectronic module at the frequencies of the signals involved in the operation of that circuitry.

Figure 4:
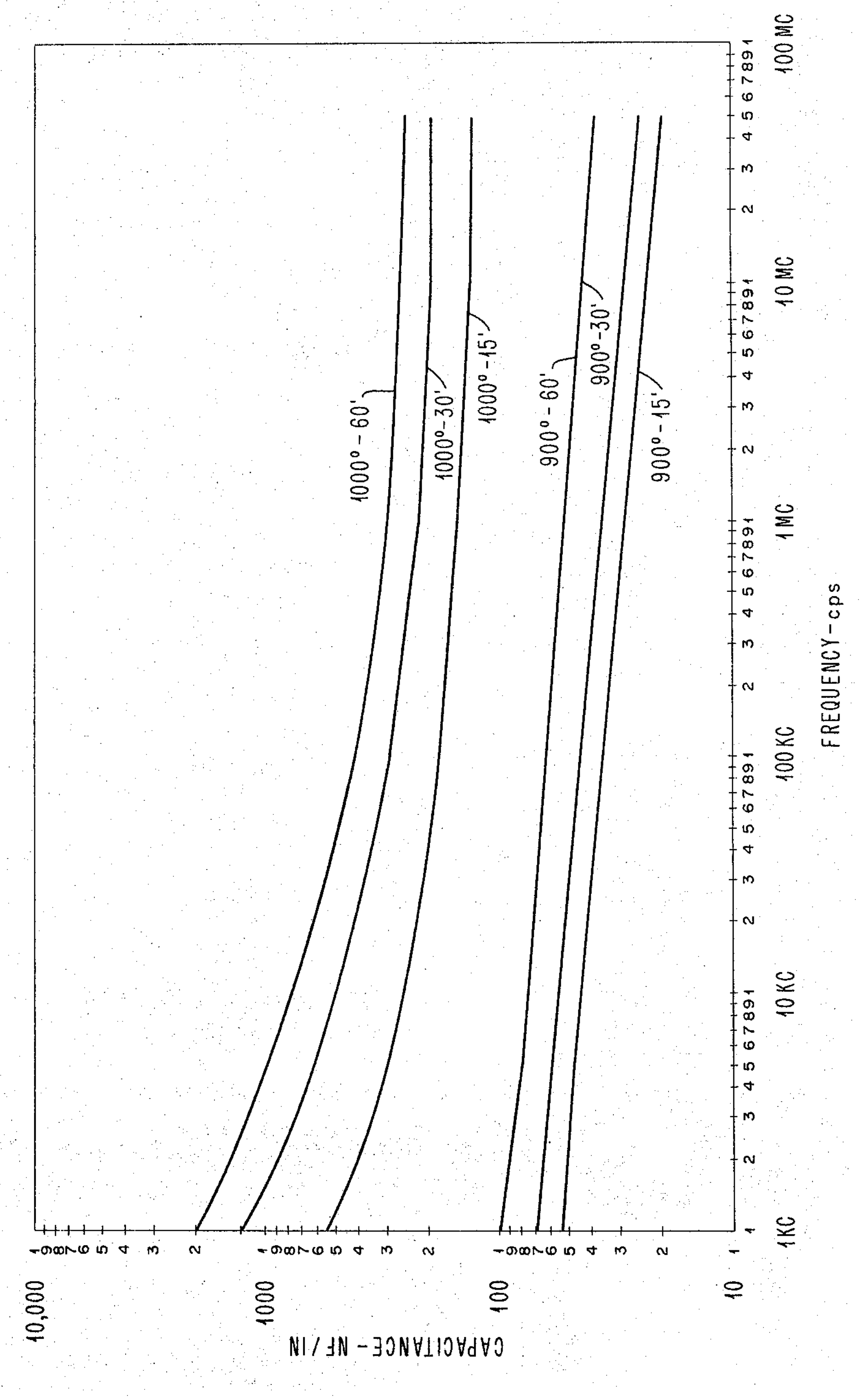
FIGURE 4 is a graph illustrating the frequency dependency of the capacitance of the present invention.
Figure 5:
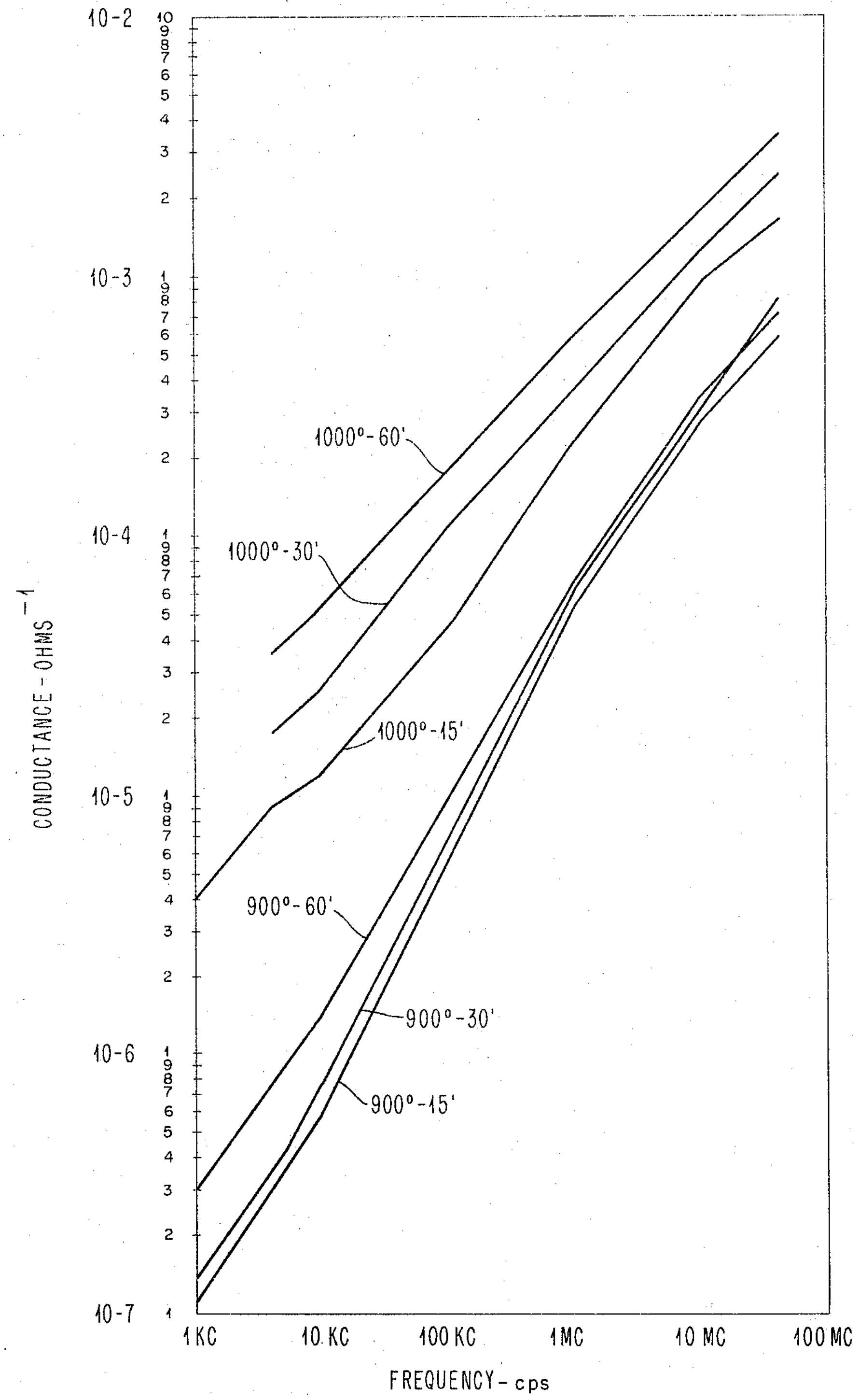
FIGURE 5 is a graph illustrating the frequency dependency of the conductivity of the present invention.

To illustrate the frequency dependency of both the capacitance and conductivity of a capacitor employing a dielectric of the present invention, reference is now made to FIGURES 4 and 5 where FIGURE 4 includes a series of curves of capacitance versus frequency for different firing temperatures and firing times of the dielectric material and FIGURE 5 includes a set of curves representing conductivity versus frequency for different firing times and firing temperatures of the dielectric material. In the case of both curves, the dielectric material is a sintered mixture of zinc oxide with 3 percent bismuth trioxide and the two different firing temperatures are 900° C. and 1000° C. for firing times of 15 minutes, 30 minutes and 60 minutes.

It will be observed from these curves that both the capacitance and the conductivity increase with an increase in the firing temperature and also with increase in the firing time. It will also be observed that the conductance increases (or, conversely, the resistivity decreases) as the frequency is increased and that the capacitance decreases with the increase in frequency although this decrease is not as abrupt as the decrease of the resistivity.

It has also been observed that the higher firing temperatures and longer firing times achieve a D.C. resistance that is less dependent on operating temperatures of the dielectric.

As has been described above, the present invention is directed toward a capacitor having as a dielectric material a sintered mixture of N and P type semiconductor oxides, which material is characterized by a dielectric constant of the order of 1000 and a resistivity of less than $10^6$ ohm-centimeters. The primary N-type semiconductor oxide employed in the present invention is zinc oxide and the principle P-type oxides include bismuth trioxide, lead oxide, cupric oxide and cuprous oxide with the highest dielectric constants being achieved with the employment of bismuth trioxide. More specifically, the present disclosure teaches that optimum values of the dielectric constant are achieved for the combination of 3%–5% bismuth trioxide and 95%–97% zinc oxide. The present disclosure also teaches that the dielectric constant can be further enhanced by the addition of no more than 10% and preferably 7% of a semiconductor oxide to the electrode materials of the capacitor. However, when such a semiconductor oxide is added to the electrode material, the optimum values of the dielectric constant are achieved for a dielectric having a combination of 2%–4% bismuth trioxide and 96%–98% zinc oxide.

With the dielectric materials of the present invention, capacitors can be formed that are of sufficiently small size as to be compatible with microelectronic circuits and yet have a capacitance of the order of 500,000 pf./in.$^2$. While the capacitance of these materials decrease about 50% in going from an operation at 1 kilocycle to an operation at 10 megacycles, the shunt resistance decreases from the order of 1000 ohms to 1 or 2 ohms over the same frequency range. When such a capacitor is operated at a frequency of 10 megacycles, the total impedance is about 1 ohm and is characterized by a damping factor of the order of 95 percent. These unique properties provide excellent damping networks to prevent false switching and power supply ringing in high speed applications.

While the present invention has been particularly shown and described with reference to preferred embodiments of specific compositions, it will be understood by those skilled in the art that changes and modifications in form and details may be made without departing from the spirit and scope of the present invention.

What is claimed is:

1. In an electrical circuit including a power supply and a microelectronic module circuit connected between ground and said power supply, the combination of a high capacitance decoupling device connected in decoupling relationship to said module circuit, said device comprising:
  first and second electrodes; and
  a layer of a dielectric type material secured between said electrodes, said material including at least 94% zinc oxide and no more than 6% bismuth trioxide.

2. In an electrical circuit including a power supply and a microelectronic module circuit connected between ground and said power supply, the combination of a high capacitance decoupling device connected in decoupling relationship to said module circuit, said device comprising:
  first and second electrodes; and a layer of a dielectric type material secured between said electrodes, said material including a sintered mixture of 95%–97% zinc oxide and 3%–5% bismuth trioxide.

3. A high capacitance decoupling device for employment in electrical circuits, said device comprising:
  first and second electrodes; and
  a layer of a dielectric type material secured between said electrodes, said material including at least 94% zinc oxide and no more than 6% bismuth trioxide;
  said electrodes being of a conductive material including no more than 10% of a semiconductor oxide.

4. A high capacitance decoupling device according to claim 3 wherein the semiconductor oxide included in the electrode material is bismuth trioxide.

5. A high capacitance decoupling device for employment in electrical circuits, said device comprising:
  first and second electrodes; and
  a layer of a dielectric type material secured between said electrodes, said material including a sintered mixture of 96%–98% zinc oxide and 2%–4% bismuth trioxide;
  said electrodes being of a conductive material including no more than 10% by weight of bismuth trioxide.

6. In an electrical circuit including a power supply and a microelectronic module circuit connected between ground and said power supply, the combination of a high capacitance decoupling device connected in decoupling relationship to said module circuit, said device comprising:
  first and second electrodes; and
  a dielectric material consisting of at least 94% zinc oxide and no more than 6% of a P type semiconductor oxide selected from the group consisting of bismuth trioxide, lead oxide, cupric oxide and cuprous oxide.

7. In an electrical circuit including a power supply and a microelectronic module circuit connected between ground and said power supply, the combination of a high capacitance decoupling device connected in decoupling relationship to said module circuit, said device comprising:
  first and second electrodes; and
  a layer of dielectric material secured between said electrodes, said material consisting of at least 94% zinc oxide and no more than 6% of a P type semiconductor oxide selected from the group consisting of bismuth trioxide, lead oxide, cupric oxide and cuprous oxide;
  said electrodes being of a conductive material including no more than 10% of a semiconductor oxide.

References Cited by the Examiner

UNITED STATES PATENTS

| | | | |
|---|---|---|---|
| 2,509,758 | 5/1950 | Brockman | 317—258 |
| 3,080,239 | 3/1963 | Zlotnick | 317—258 X |

FOREIGN PATENTS

| | | |
|---|---|---|
| 275,258 | 8/1951 | Switzerland. |

OTHER REFERENCES

New Piezoelectric Compounds Exhibit Large Coupling Constant, in Bell Lab. Record, July 1960, p. 269.

Peterson, D.: Evaluation of Vapor Plated Oxide Film for Capacitor Dielectric, in I.E.E.E. Transactions on Component Parts, pp. 119–122, September 1963.

LEWIS H. MYERS, *Primary Examiner.*

JOHN F. BURNS, *Examiner.*

E. GOLDBERG, *Assistant Examiner.*